(12) United States Patent
Kitamura

(10) Patent No.: US 7,543,263 B2
(45) Date of Patent: *Jun. 2, 2009

(54) AUTOMATIC TRACE SHAPING METHOD

(75) Inventor: Tamotsu Kitamura, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 74 days.

This patent is subject to a terminal disclaimer.

(21) Appl. No.: 11/760,975

(22) Filed: Jun. 11, 2007

(65) Prior Publication Data

US 2008/0022234 A1    Jan. 24, 2008

(30) Foreign Application Priority Data

Jun. 30, 2006    (JP)    ............... 2006-181426

(51) Int. Cl.
*G06F 17/50*    (2006.01)

(52) U.S. Cl. ............... 716/13; 716/4; 716/11; 716/15

(58) Field of Classification Search ............... None
See application file for complete search history.

(56) References Cited

U.S. PATENT DOCUMENTS

| | | | | |
|---|---|---|---|---|
| 6,226,560 | B1 * | 5/2001 | Hama et al. ............... | 700/97 |
| 6,596,549 | B2 * | 7/2003 | Kitamura et al. ............... | 438/6 |
| 6,662,351 | B2 * | 12/2003 | Kitamura et al. ............... | 716/11 |
| 7,017,137 | B2 * | 3/2006 | Wadland et al. ............... | 716/13 |
| 7,191,415 | B2 * | 3/2007 | Kitamura et al. ............... | 716/5 |
| 2006/0071322 | A1 * | 4/2006 | Kitamura ............... | 257/692 |
| 2006/0271898 | A1 * | 11/2006 | Kitamura ............... | 716/12 |
| 2007/0238221 | A1 * | 10/2007 | Kitamura ............... | 438/106 |

FOREIGN PATENT DOCUMENTS

| | | |
|---|---|---|
| GB | 2371893 A | 8/2002 |
| GB | 2436379 A | 9/2007 |
| JP | 03127277 A | 10/1989 |
| JP | 5-055305 | 3/1993 |

(Continued)

OTHER PUBLICATIONS

"An Operating Method of an Integrated Printed-Circuit Board CAD Tool", Design Wave Magazine, CQ Publishing Co., Ltd., pp. 51-56. Relevance is on p. 52—"Traces are often disposed in directions of arbitrary angle on the surface of the substrate of LSI."

*Primary Examiner*—Leigh Marie Garbowski
(74) *Attorney, Agent, or Firm*—Paul & Paul

(57) ABSTRACT

An automatic trace shaping method comprises the steps of: setting sets of coaxial equiangular octagons each having sides parallel with a predetermined reference line; performing a process for tentatively disposing the traces each having segments passing between the adjacent vias so that such segments overlap any sides of the equiangular octagons that are set for the vias existing at positions nearest to such segments sequentially for each trace so that at least clearance can be secured from the trace for which the process has been completed immediately before; and performing a process for further correcting positions of the tentatively disposed traces that cannot secure the clearance from the other adjacent tentatively disposed traces so that at least the clearance can be secured from such other tentatively disposed traces sequentially in an order inverse to that in the tentative disposition process for the traces.

9 Claims, 12 Drawing Sheets

FOREIGN PATENT DOCUMENTS

| | | |
|---|---|---|
| JP | 06301743 A | 4/1993 |
| JP | 9-069118 | 3/1997 |
| JP | 10-209288 | 8/1998 |
| JP | 11-161694 | 6/1999 |
| JP | 2001-044288 | 2/2001 |
| JP | 2001-350813 | 12/2001 |
| JP | 2002-083006 | 3/2002 |

* cited by examiner

Fig.3B ———————— 0-DEGREE TRACE

Fig.3C  /  45-DEGREE TRACE

Fig.3D  |  90-DEGREE TRACE

Fig.3E  \  135-DEGREE TRACE

⋯ VIA

⋯ PAD

⋯ TRACE

AUTOMATIC TRACE SHAPING METHOD

BACKGROUND OF THE INVENTION

1. Field of the Invention

The present invention relates to an automatic trace shaping method for automatically shaping existing traces consisting of straight and/or curved lines that are designed to be disposed in arbitrary directions on a surface of a substrate of a semiconductor package into traces each consisting of a combination of segments in predetermined directions by using computation.

2. Description of the Related Art

In LSI (Large-scale integrations), PCB (Printed-circuit boards) and the like, for example, as set forth in Jono, "An operating method of an integrated printed-circuit board CAD tool", Design Wave Magazine, CQ Publishing Co., Ltd., June 2003, pp. 51-56, it is typical that a trace is comprised of a plurality of straight line segments and the trace is designed so that these segments lie in directions of 90 or 45 degrees.

The LSI and PCB have pattern characteristics which have relatively large spaces around the traces and disposed positions and the shapes of obstacles have a certain amount of regularity. The traces in an LSI, PCB and the like can be easily designed according to design rules that allow computation by a computer, and therefore, several automatic wiring methods have already been proposed.

For example, as a typical example of an automatic wiring method for an LSI and PCB, there is a method called a labyrinth search method as set forth in Japanese Unexamined Patent Publication No. 11-161694, Japanese Unexamined Patent Publication No. 2001-350813, Japanese Unexamined Patent Publication No. 2001-044288, or Japanese Unexamined Patent Publication No. 10-209288. In this labyrinth search method, trace routes on a substrate are set so as to secure clearance from obstacles and so as to not intersect the obstacles by bypassing such obstacles in the directions of 90 degrees or in some cases 45 degrees.

In contrast to this, on substrates of semiconductor integrated circuit mounting packages (hereinafter simply referred to as "semiconductor packages") such as a PBGA, EBGA and the like, there are a large number of elements, such as planes, gates, marks, dummy pads, internal components or other traces in the packages and so on, that may obstruct the traces and shapes and the disposed positions or angles of such obstacles may vary significantly. Further, vias, balls, bonding pads (B/P), flip chip pads (F/C) or the like, which are to be starting or end points of the traces, may be positioned at various points, and moreover, sufficient space often cannot be secured around the traces. Therefore, in the trace design of semiconductor packages, traces are often disposed in directions of arbitrary angles on the surface of the substrate of the semiconductor package. In the trace design of semiconductor packages, a designer typically designs the trace routes of the semiconductor packages on a virtual plane by trial and error depending on the designer's skill, experience and intuition, for example, by using a CAD system.

For example, as a trace design method for semiconductor packages, there has been proposed an automatic wiring method that uses a CAD system for generating, by automatic computation, trace shapes satisfying design rules, for example, by generating circular arcs around vias according to the design rules and combining the traces based on the tangents of the circular arcs, as set forth in Japanese Unexamined Patent Publication No. 2002-083006.

Further, for example, there has been proposed a semi-automatic wiring method that does not rely on automatic computation, but generates an outlined route manually and determines an optimal route when semiconductor elements other than two or more semiconductor elements between which a trace route is intended to be set are assumed to be obstacles, as set forth in Japanese Unexamined Patent Publication No. 09-069118.

Still further, there has been proposed a trace design method of semiconductor packages that implements traces in directions of specific angles, as set forth in Japanese Unexamined Patent Publication No. 05-055305.

As described above, when traces in arbitrary directions (at arbitrary angles), for example, traces comprised of straight and/or curved lines, are designed in semiconductor packages, a CAD that complies with such trace design is typically used for the semiconductor packages. In contrast, a CAD for an LSI is good at designing traces that consist of a combination of segments in the direction of "45×n" degrees (where n is an integer) with respect to a predetermined reference line (hereinafter also referred to as "45-degree traces" or "inclined 45-degree traces"), but is weak in designing curved traces in arbitrary directions. In other words, there is no compatibility between trace design data designed by a CAD for semiconductor packages and that designed by a CAD for an LSI. Generally, traces in circuit boards are often designed by using a CAD for an LSI, and in this case, even though the trace design for semiconductor packages has already been completed, the traces have to be redesigned so that the trace design can also be utilized in a CAD for an LSI.

Further, in order to implement the 45-degree traces described above by using a CAD for semiconductor packages, the designer has to set the direction in which the traces can be disposed at 45 degrees in the CAD software for semiconductor packages, and while viewing a display screen, has to manually design each segment or each trace one by one by trial and error so as to satisfy requirements for clearance (lines and spaces). The traces on the surface of the substrates of semiconductor packages are very dense and it is difficult to secure sufficient space around the traces, and therefore, it is difficult to implement 45-degree traces.

In the manual trace design by trial and error as described above, as traces become more complicated, the effort, time and difficulty for achieving optimal traces is increased. Further, an unevenness in quality of finished products in which traces have been designed is also increased. In reality, because manual trace design by trial and error requires 3-10 days for one product, it is not economical and requires a compromise of design quality.

In view of the above problems, it is an object of the present invention to provide an automatic trace shaping method that can automatically shape existing traces consisting of straight and/or curved lines that are designed to be disposed in arbitrary directions on the surface of a substrate of a semiconductor package into traces which consist of a combination of segments having specific angles with respect to a predetermined reference line.

SUMMARY OF THE INVENTION

In order to achieve the above object, in a first aspect of the present invention, there is provided an automatic trace shaping method for automatically shaping existing traces consisting of straight and/or curved lines that are designed to be disposed in arbitrary directions on a surface of a substrate of a semiconductor package into traces which consist of a combination of segments in directions of "45×n" degrees (where n is an integer) with respect to a predetermined reference line by using computation, the method comprising the steps of:

setting sets of equiangular octagons each having sides parallel with the predetermined reference line for each of the vias on the surface of the substrate of the semiconductor package, wherein the equiangular octagons in each of the sets are set so that they are separated from each other at least by a distance that can secure clearance between adjacent traces and so that they are disposed coaxially about a center position of each of the vias as their common center; performing a tentative disposition process for tentatively disposing the existing traces each having segments passing between the vias that are adjacent to each other so that such segments overlap any sides of the equiangular octagons that are set for the via existing at a position nearest to such segments, wherein the tentative disposition process is performed sequentially for each of the existing traces so that at least clearance can be secured from the existing trace for which the tentative disposition process has been completed immediately before; and performing a correction process for further correcting positions of the tentatively disposed existing traces that cannot secure the clearance from the other adjacent tentatively disposed existing traces so that at least the clearance can be secured from such other adjacent tentatively disposed existing traces, after the tentative disposition process in the tentative disposition step is completed for all the existing traces wherein the correction process is performed sequentially for each of the tentatively disposed existing traces in an order inverse to that in the tentative disposition process for the existing traces in the tentative disposition step. Here, the predetermined reference line refers to one of four contour sides of the semiconductor package from which the existing traces to be shaped are drawn out. According to the first aspect of the present invention, also in semiconductor packages having a high trace density, trace shaping to reliably secure the clearance between the traces cannot be implemented manually, but is done automatically by using an arithmetic processing unit such as a computer.

In a second aspect of the present invention, there is provided an automatic trace shaping method for automatically shaping existing traces consisting of straight and/or curved lines that are designed to be disposed in arbitrary directions on a surface of a substrate of a semiconductor package into traces each consisting of a combination of segments in directions of "45×n" degrees (where n is an integer) with respect to a predetermined reference line by using computation, wherein, when the existing traces are shaped by setting equiangular octagons having sides parallel with the predetermined reference line, and then, correcting the positions of the existing traces so that each of the existing traces overlaps any sides of the equiangular octagons, these equiangular octagons are set so as to circumscribe respective clearance circles that are circles about respective vertices on contours of obstacles on the surface of the substrate and that indicate positions where clearance can be secured from such obstacles. Here, the predetermined reference line refers to one of four contour sides of the semiconductor package from which existing traces to be shaped are drawn out. According to the second aspect of the present invention, the automatic trace shaping can also be implemented in a case in which a plurality of obstacles are disposed adjacent to each other on the surface of the substrate of the semiconductor package.

In this connection, the automatic trace shaping method according to the present invention can be implemented in the form of a software program that can be operated by an arithmetic processing unit such as a computer. An apparatus for performing the above-mentioned processes and a program for allowing the computer to perform the above-mentioned processes can be implemented easily by those skilled in the art who understand the following description. Further, it is evident for those skilled in the art that the program for allowing the computer to perform the above-mentioned processes may be stored in storage media.

BRIEF DESCRIPTION OF THE DRAWINGS

The present invention will be more clearly understood from the description as set below with reference to the accompanying drawings, wherein:

FIGS. 3A-3E are diagrams defining the directions of traces in the embodiments of the present invention;

DESCRIPTION OF THE PREFERRED EMBODIMENTS

Figure 1:
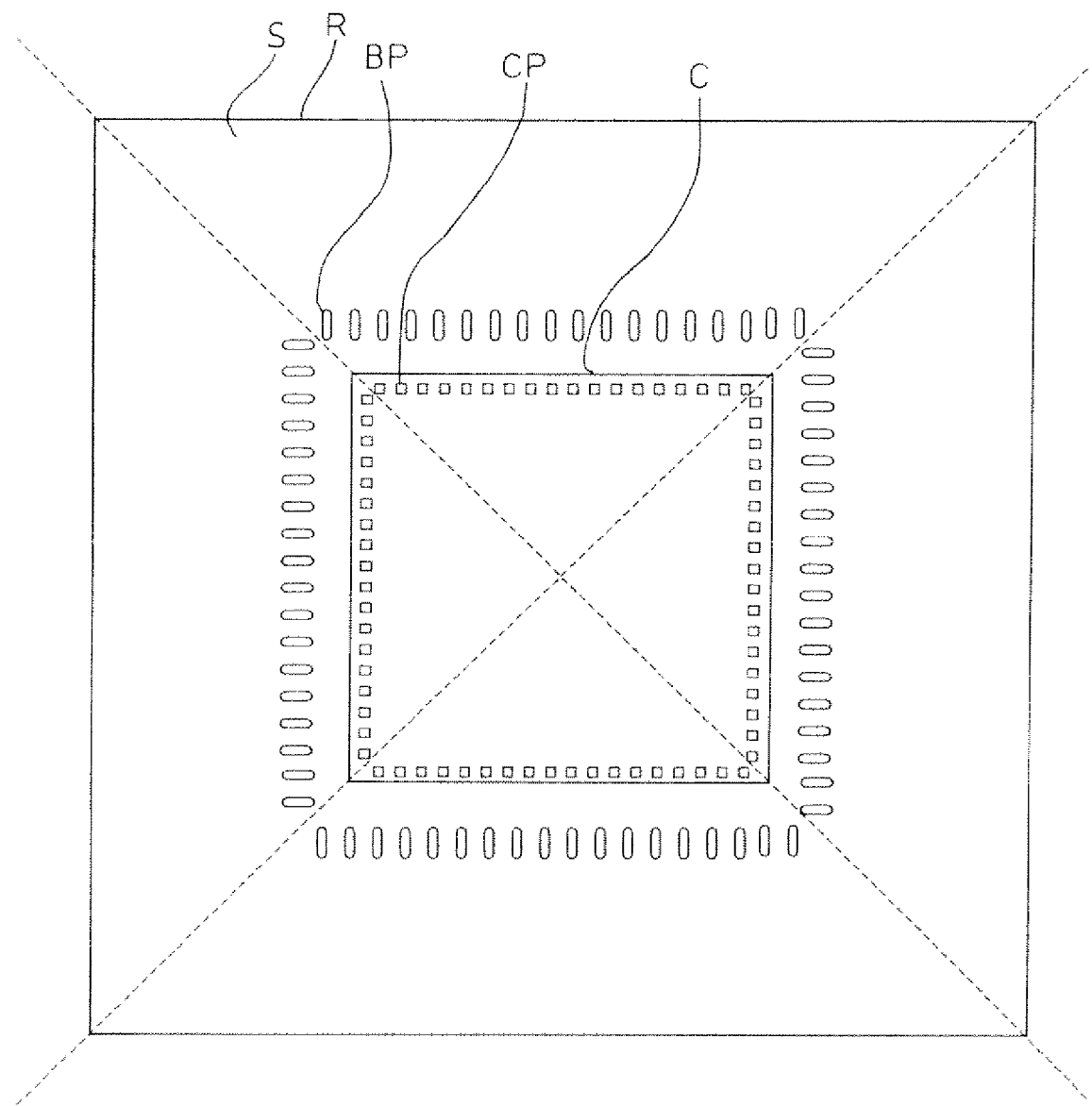
FIG. 1 is a diagram showing an exemplary arrangement of bonding pads on a surface of a substrate of a semiconductor package.

Before describing the embodiments of the present invention, the traces on a surface of a substrate of a semiconductor package will be briefly described. FIG. 1 is a diagram showing an exemplary arrangement of bonding pads on a surface of a substrate of a semiconductor package. A semiconductor chip C is mounted about the center of the surface of the substrate of the semiconductor package S. The semiconductor chip C has a quadrilateral shape, and chip pads CP are also arranged to form the quadrilateral shape.

Here, the surface of the substrate of the semiconductor package S is divided it into four regions by diagonal lines on the surface of the substrate of the semiconductor package S, or in other words, boundary lines indicated by dotted lines in the figure. The chip pads CP that are arranged in a line in the neighborhood of a contour (in other words, an edge) of quadrilateral semiconductor chip C are each connected to the respective bonding pads BP that belong to the same region as that of such chip pads CP arranged in a line via respective traces (not shown). Further, traces (not shown) are provided from the bonding pads BP that are similarly arranged in a line toward a contour R (in other words, an edge) of the semiconductor package S that belongs to the same region as that of such bonding pads BP arranged in a line. In an edge portion of the semiconductor package S, plated leads (not shown) are drawn out in a direction orthogonal to the contour R of the semiconductor package S. Here, the plated leads may not be provided in the edge portion of the semiconductor package S, and in this case, the traces themselves are provided in the direction orthogonal to the contour R of the semiconductor package S in the edge portion of the semiconductor package S. In the embodiments of the present invention described below, though an automatic trace shaping process in one of the four regions described with reference to FIG. 1 will be described, this process can be applied similarly to the other three regions.

Figure 2:
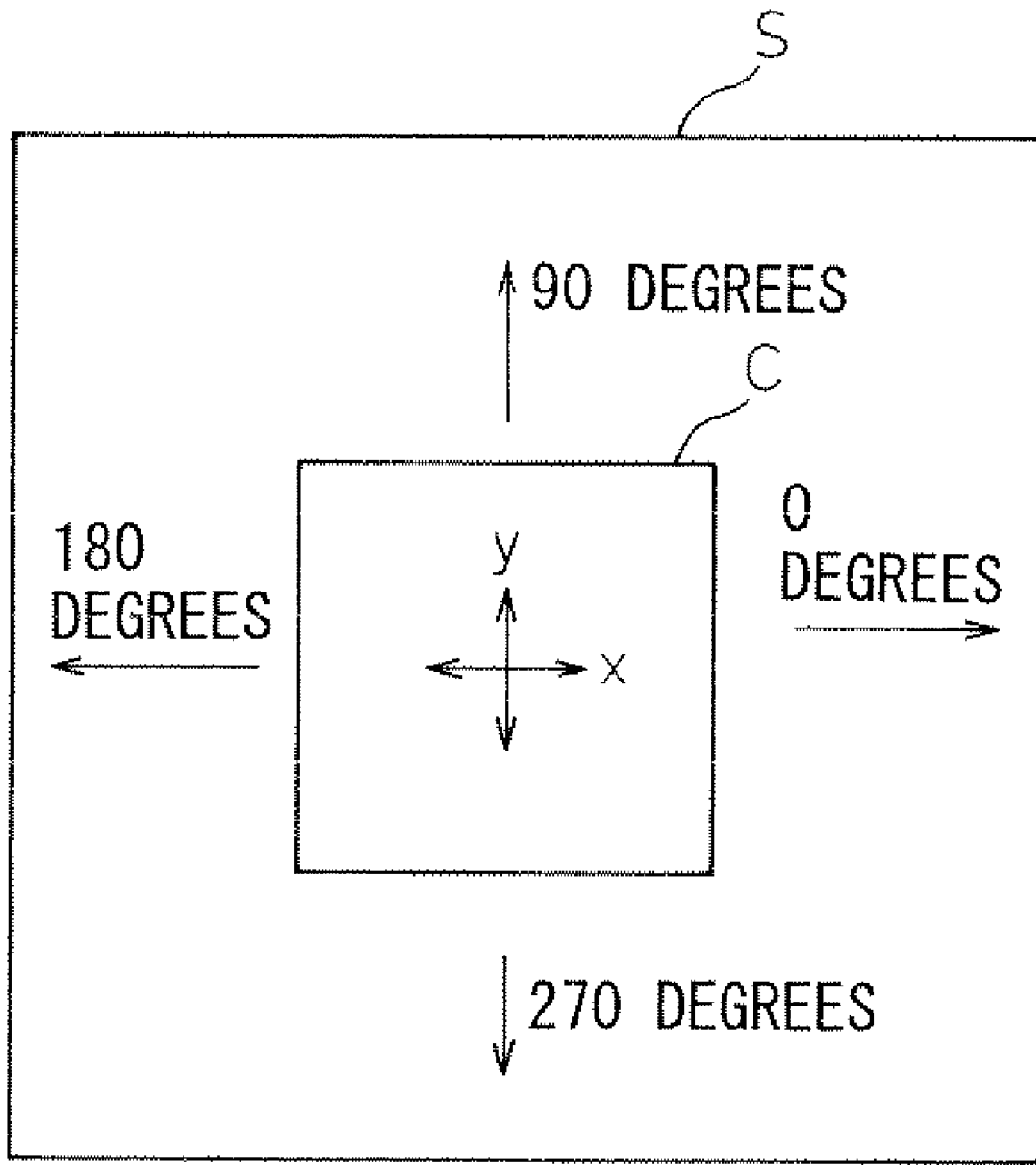
FIG. 2 is a diagram defining coordinate axes used in embodiments of the present invention.
Figure 3A:
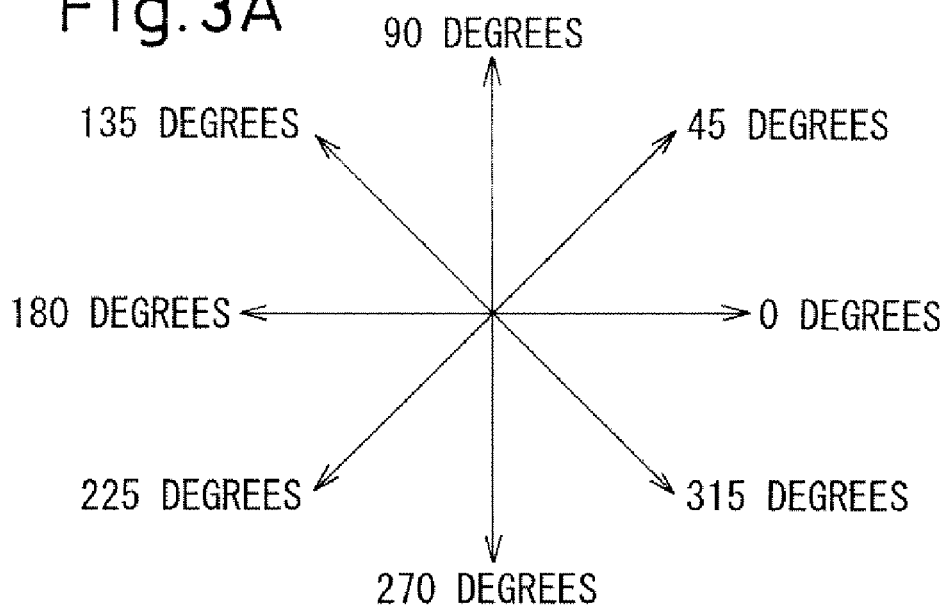

FIG. 2 is a diagram defining coordinate axes used in the embodiments of the present invention, and FIGS. 3A-3E are diagrams defining the directions of traces in the embodiments of the present invention. In these embodiments the xy coordinate axes are defined on a surface of a substrate of a semiconductor package S as shown in the figure. Then, the directions of the traces on the surface of the substrate of the semiconductor package S are defined so that the positive direction on the x axis is the direction of 0 degrees, the positive direction on the y axis is the direction of 90 degrees, the negative direction on the x axis is the direction of 180 degrees, and the negative direction on the y axis is the direction of 270 degrees.

Here, when the predetermined reference line mentioned above is oriented in the direction of 0 degrees, the traces provided to be disposed in the directions of "45×n" degrees (where n is an integer) are substantially classified into the 0-degree traces as shown in FIG. 3B, the 45-degree traces as shown in FIG. 3C, the 90-degree traces as shown in FIG. 3D, and the 135-degree traces as shown in FIG. 3E. The 135-degree traces are generally considered to have the same quality as 45-degree traces (inclined 45-degree traces). In the embodiments of the present invention, the predetermined reference line mentioned above is set on one of four contour sides of the semiconductor package from which existing traces to be shaped are drawn out.

Figure 4:
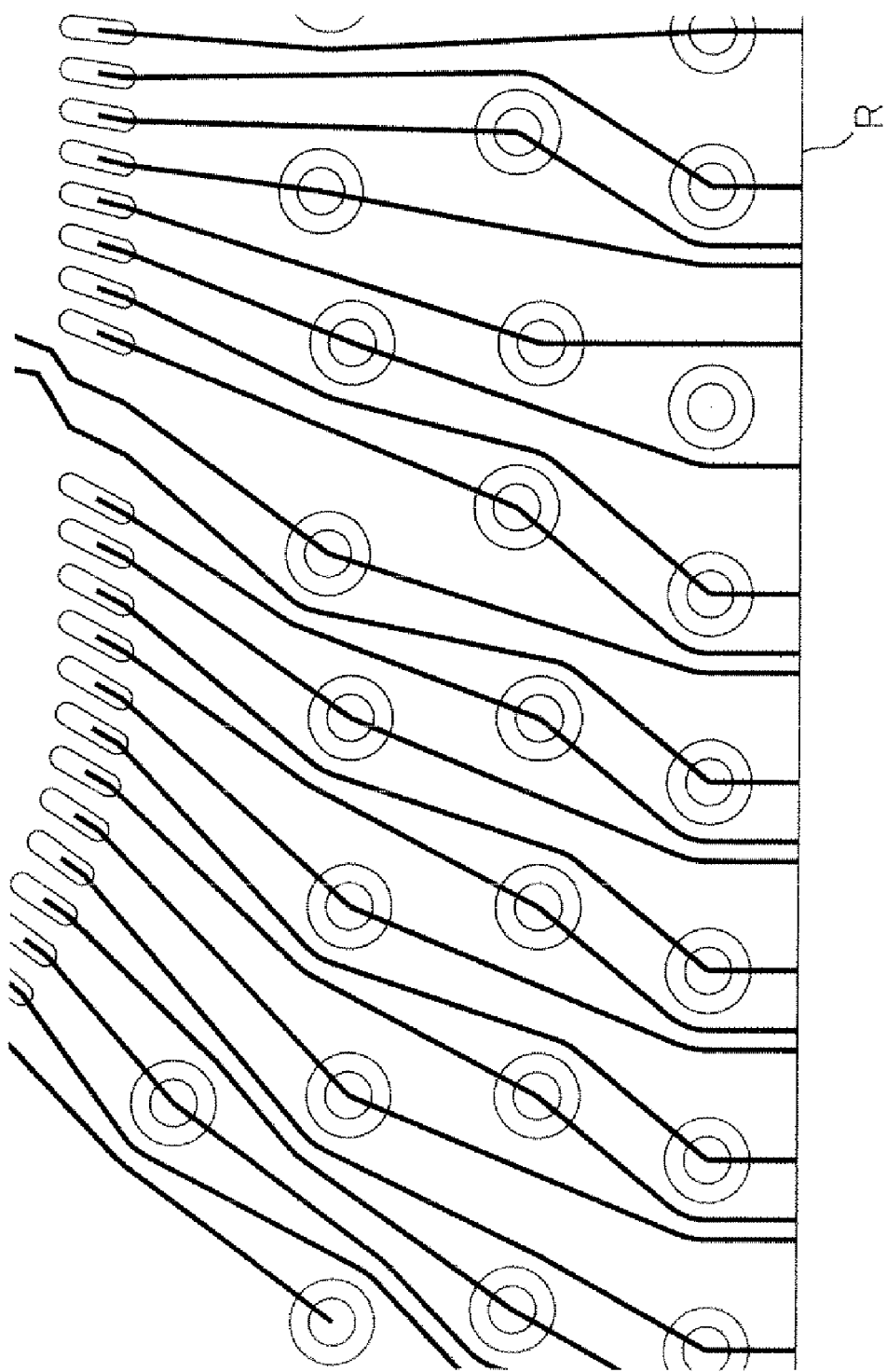
FIG. 4 is a diagram showing exemplary existing traces consisting of straight and/or curved lines that are designed to be disposed in arbitrary directions on a surface of a substrate of a semiconductor package.
Figure 5:
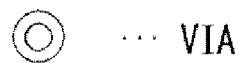
FIG. 5 is a diagram for describing legends of symbols for vias, bonding pads and traces indicated in the figures attached to this specification.
Figure 5:
Figure 5:

In the embodiments of the present invention, it is assumed that existing traces consisting of straight and/or curved lines are designed to be disposed in the arbitrary directions on the surface of the substrate of the semiconductor package and designed so as to secure clearance from other existing traces, vias or obstacles adjacent to such existing traces. An example of such existing traces is shown in FIG. 4. FIG. 4 is a diagram showing the exemplary existing traces consisting of straight and/or curved lines that are designed to be disposed in the arbitrary directions on the surface of the substrate of the semiconductor package. Hereinafter, traces shown in the accompanying figures are at least portions of the traces on the surface of the substrate of the semiconductor package. Further, FIG. 5 is a diagram describing the legends of the symbols for the vias, the bonding pads and the traces indicated in the figures attached to this specification. Hereinafter, the legends of FIG. 5 are applied to the figures indicating the vias, the bonding pads and/or the traces in principle, but some traces are indicated by thick solid lines. As illustrated in FIG. 4, the existing traces each consisting of a combination of straight and curved lines are disposed from the bonding pads arranged in a line toward the contour of the semiconductor package in arbitrary directions (in other words, at arbitrary angles). The existing traces are disposed so that they are orthogonal to the contour R of the semiconductor package. Further, in order to avoid intersection with vias, a connection which is not necessary, the traces near such vias consist of curved lines.

Figure 6:
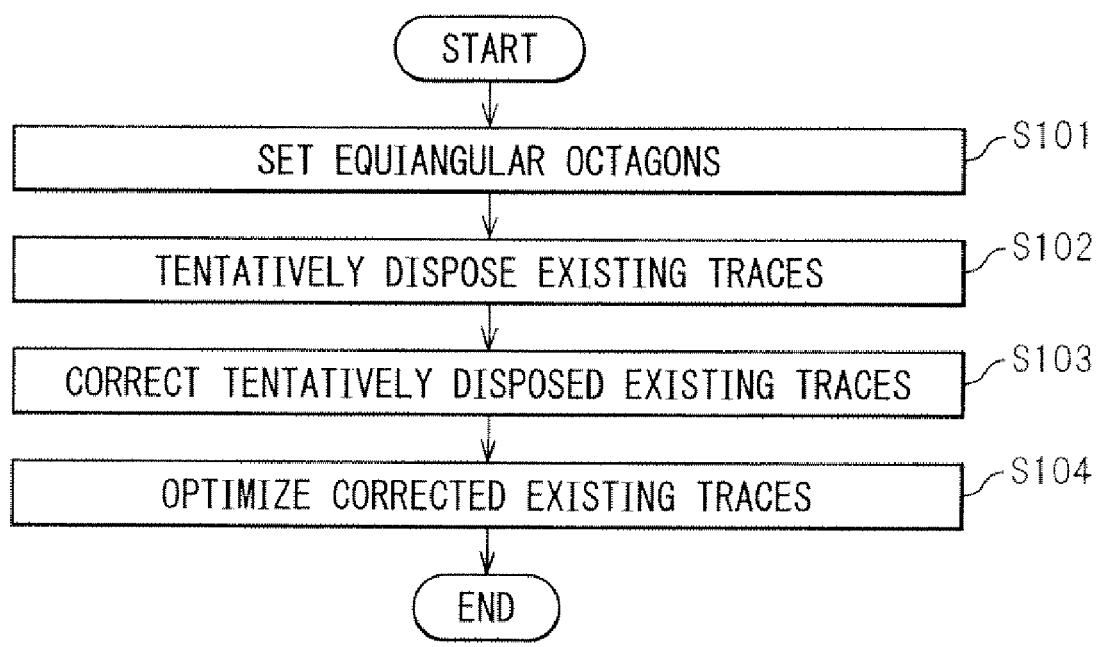
FIG. 6 is a flow chart showing an operational flow of an automatic trace shaping method according to a first embodiment of the present invention.

A first embodiment of the present invention automatically shapes existing traces that are provided densely on a surface of a substrate of a semiconductor package while securing clearance. FIG. 6 is a flow chart showing an operational flow of the automatic trace shaping method according to the first embodiment of the present invention.

First, in step S101, sets of equiangular octagons each having sides parallel with a predetermined reference line are set for each of vias existing on the surface of the substrate of the semiconductor package. Here, the equiangular octagons in each of the sets are set so that they are separated from each other at least by a distance that can secure clearance between adjacent traces and so that they are disposed coaxially about a center position of each of the vias as their common center. Thus, the innermost equiangular octagon in each set of the coaxial equiangular octagons is set so as to circumscribe a clearance circle that indicates a position where the clearance can be secured from the via and, therefore, it is a regular octagon. In this embodiment, the predetermined reference line mentioned above is set on one of the four contour sides of the semiconductor package from which the existing traces to be shaped are drawn out. Hereinafter, in the embodiments of the present invention, the "predetermined reference line" means this contour of the semiconductor package.

Next, in step S102, a tentative disposition process for tentatively disposing existing traces each having segments passing between the vias that are adjacent to each other so that such segments overlap any sides of the equiangular octagons that are set for the vias existing at positions nearest to such segments is performed. This tentative disposition process is programmed to be performed sequentially for each existing trace, and when the tentative disposition process is performed for one existing trace, such existing trace is disposed tentatively so that at least clearance can be secured from the existing trace for which the tentative disposition process has been completed immediately before. The innermost equiangular octagon in each set of the coaxial equiangular octagons is set so as to circumscribe the clearance circle that indicates a position where the clearance can be secured from the via.

Here, the tentative disposition process in step S102 will be described in further detail as follows. The tentative disposition process in step S102 has: a first step of, with respect to each of the existing traces having the segments passing between the vias that are adjacent to each other, redisposing such segments so as to overlap any sides of the equiangular octagons; a second step of connecting the two segments that are tentatively disposed based on the equiangular octagons adjacent to each other substantially in a disposing direction of the existing trace by a segment in a direction of "45×n" degrees (where n is an integer) with respect to the predetermined reference line; and a third step of setting the trace consisting of a combination of the two segments obtained in the first step and the segment in the direction of "45×n" degrees (where n is an integer) obtained in the second step as the tentatively disposed existing trace. Here, the first step comprises: a determination step of determining whether each of the segments of the existing trace intersecting the corresponding equiangular octagon forms an angle from 45 to 135 degrees with the predetermined reference line at an intersection point of such equiangular octagon and the segment of the existing trace or not; and a selection step of, when the determination step determines that the segment of the existing trace forms the angle from 45 to 135 degrees, selecting, among sides of the equiangular octagon that is set to correspond to the segment of such existing trace, a side in the direction of 90 degrees with respect to the predetermined reference line in the neighborhood of an intersection point of the segment of such existing trace and such equiangular octagon, or otherwise, selecting, among the sides of the equiangular octagon that is set to correspond to the segment of such existing trace, a side in the direction of 45 degrees or a side in the direction of 135 degrees with respect to the predetermined reference line in the neighborhood of the intersection point of the segment of such existing trace and such equiangular octagon. The segments overlapping the sides selected in this selection step are determined as the "two segments" obtained in the first step described above. Further, the first step further comprises a changing step of extending or shortening the sides selected in the selection step by predetermined lengths and the segments overlapping the sides extended or shortened in such changing step are determined as the "two segments" obtained in the first step.

After the tentative disposition process in step S102 is completed for all of the existing traces, in step S103, a correction process for each of the tentatively disposed existing traces is performed sequentially for each tentatively disposed existing trace in an order inverse to that in the programmed tentative disposition process for the existing traces in step S102. In the correction process for the tentatively disposed existing traces, it is inspected whether the tentatively disposed existing traces that cannot secure the clearance from the other adjacent tentatively disposed existing traces exist or not, and positions of the tentatively disposed existing traces that cannot secure the clearance are further corrected so that at least the clearance can be secured from such other adjacent tentatively disposed existing traces.

After the correction process in step S103 is completed for all of the existing traces, in step S104, an optimization process for further optimizing the disposed positions of the corrected existing traces is performed sequentially for each of the corrected existing traces in an order identical to that in the programmed tentative disposition process for the existing traces in step S102 or, in other words, in an order inverse to that in the correction process for the tentatively disposed existing traces in step S103.

FIGS. 7, 8, 9A, 9B and 10 are diagrams describing the automatic trace shaping method according to the first embodiment of the present invention with reference to a specific example. In this specific example, it is assumed that existing traces consisting of straight line segments pass between vias V1-V4. In the figures, circles shown by dotted lines indicate coaxial clearance circles about the respective vias V1-V4. In particular, the clearance circles nearest to the respective vias indicate the positions where the clearance can be secured from the respective vias. Further, the clearance circles about each identical via are separated from each other by a distance that can secure the clearance between the traces. The equiangular octagons are set about each via V1-V4 so that each of the equiangular octagons circumscribes each corresponding clearance circle and has sides parallel with the predetermined reference line, and therefore are regular octagons.

Figure 7:
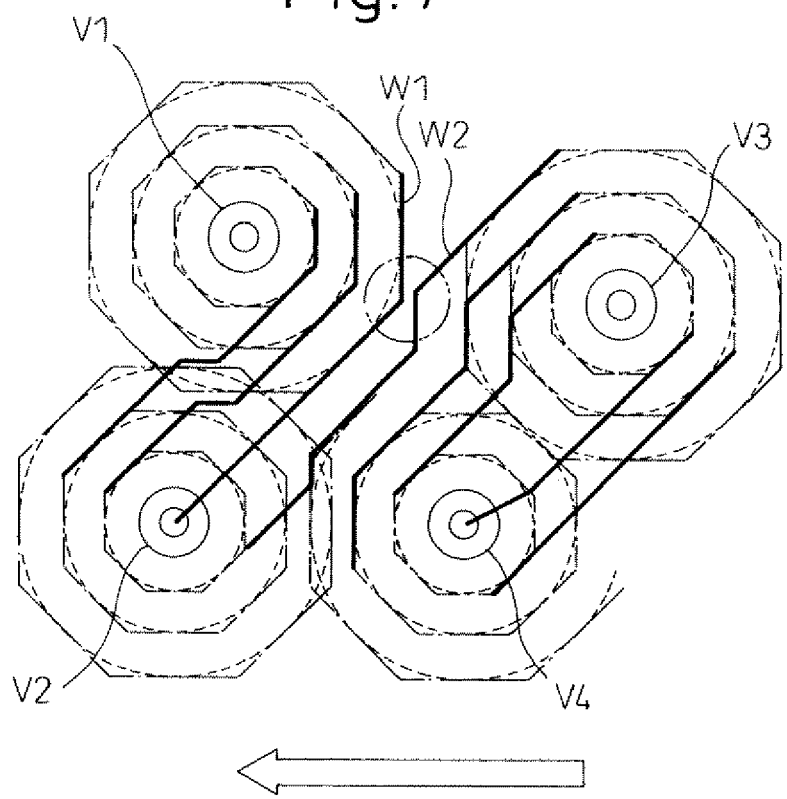
FIGS. 7, 8, 9A, 9B and 10 are diagrams describing the automatic trace shaping method according to the first embodiment of the present invention with reference to a specific example.

FIG. 7 illustrates a result when the tentative disposition process in step S102 is performed for the existing traces sequentially in a programmed processing direction indicated by a large arrow in the figure. In the tentative disposition process for any one trace, the existence of the traces that are adjacent to the trace that is being shaped at present and that are not shaped yet (in other words, existence of the traces that are to be shaped in the next step in the programmed process) is not considered, and therefore, the clearance between the trace that is being shaped at present, and the adjacent traces that are not yet shaped may not be obtained. In the example shown in FIG. 7, in the part encircled by a chain double-dashed line, the clearance between the existing trace W1 and the existing trace W2 is not obtained.

Figure 8:
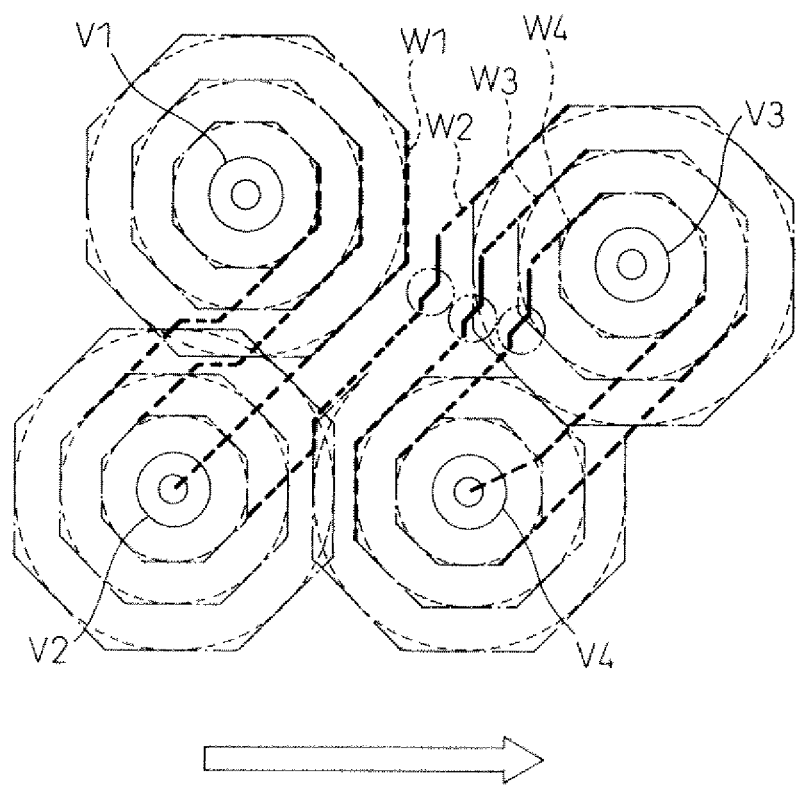

FIG. 8 illustrates the result of a correction process performed for tentatively disposed existing traces as shown in FIG. 7. As described above, the correction process for the tentatively disposed existing traces in step S103 is performed sequentially in the order inverse to that in the programmed tentative disposition process for the existing traces in step S102 but, in the example shown, the correction process is performed sequentially in a programmed processing direction indicated by a large arrow. As described with reference to FIG. 7, the clearance between the existing trace W1 and the existing trace W2 is not obtained, and therefore, as shown in FIG. 8, a position of the tentatively disposed existing trace W2 is corrected so as to secure the clearance from the tentatively disposed existing trace W1. Further, in order to obtain clearance from the existing trace W2 thus corrected, a position of the tentatively disposed existing trace W3 is also corrected. Still further, in order to obtain clearance from the existing trace W3 thus corrected, a position of the tentatively disposed existing trace W4 is also corrected. Here, in FIG. 8, it is to be noted that the corrected portions of the traces are indicated by thick solid lines and the portions of the traces that are not necessary to be corrected (in other words, the portions of the traces that can secure the clearance at their tentatively disposed positions) are indicated by thick dotted lines. As described above, according to this embodiment, the clearance between the traces can be reliably obtained.

In the existing traces illustrated in FIG. 8, the clearance between the traces can be secured, but a plurality of bending points are formed, in particular, in the portions subject to the correction process in step S103 (the portions encircled by chain double-dashed lines in FIG. 8) and the traces are redundant. As long as the clearance between the traces is obtained, there is no particular problem in product quality and success is achieved in terms of quality in manufacturing the semiconductor packages. However, it is often required that not only the clearance between the traces is reliably obtained, but also that the wiring pattern is a so-called "beautiful pattern" in which the traces are arranged regularly in a well-balanced manner. A beautiful pattern has less redundant and shorter traces, and therefore, it is economical and easy to manufacture and results in a lower rate of product error in the manufacturing process. Further, it is also electrically stable. Still further, in a substrate in which the wiring pattern is well-balanced, which is substantially uniform even when it is deformed, for example, due to heat, defects such as short circuit or a break in traces are not likely to occur. Moreover, semiconductor packages having an ordered wiring pattern and regularity are to some extent more beautiful, and as a result, often advantageous when selling semiconductor packages.

Figure 9A:
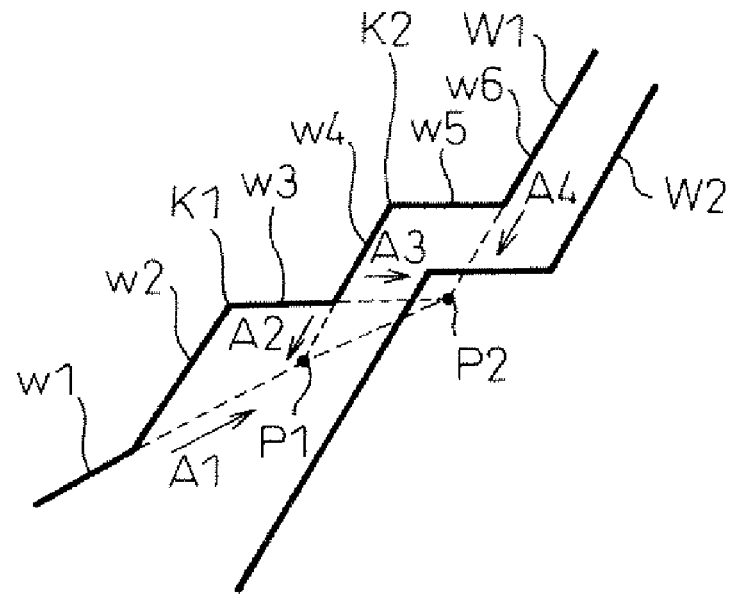
Figure 9B:
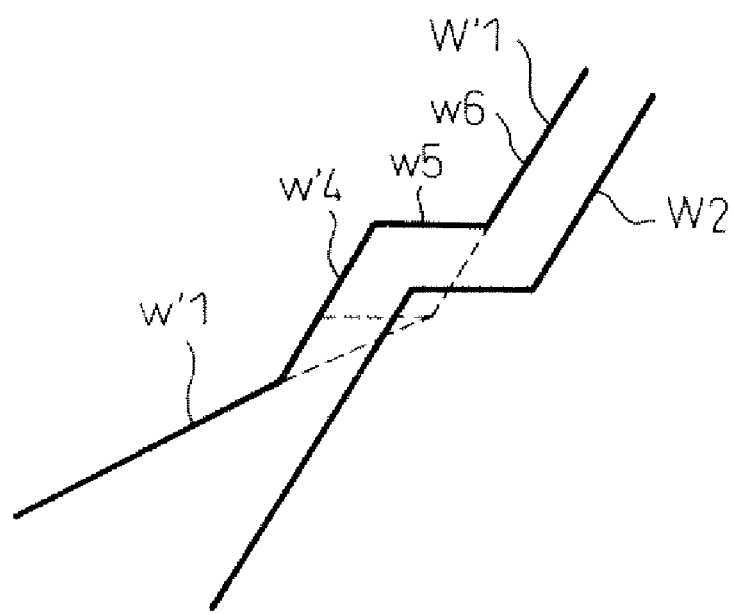

Therefore, in this embodiment, in order to eliminate the redundant portions of the traces described above, an optimization process is performed in step S104. As shown in FIG. 9A, it is assumed that, after the correction process is completed, the clearance between the existing trace W1 and the existing trace W2 is secured, but the corrected existing trace W1 has a plurality of bending points and is redundant at these points. Here, for the sake of brevity, it is assumed that the existing trace W1 consists of segments w1, w2, w3, w4, w5 and w6. In the optimization process in this embodiment, in the existing trace W1, segment w1 is extended in the direction of arrow A1 in the figure and segment w4 is extended in the direction of arrow A2 in the figure, and then, an intersection point of these extended segments is defined as P1. Even if segments w1 and w4 are extended to the intersection point P1, the clearance from the existing trace W2 can be secured, and therefore, in order to eliminate the bending point K1, these extended portions of the segments are defined as parts of the optimized trace. On the other hand, in the existing trace W1, the segment w3 is extended in a direction of arrow A3 in the figure and segment w6 is extended in a direction of arrow A6 in the figure, and then, an intersection point of these extended segments is defined as P2. If segments w3 and w6 are extended to intersection point P2, the clearance from the existing trace W2 cannot be secured. Therefore, in this case, the trace cannot be optimized and the trace determined after the correction is defined as the final trace. As a result of this optimization process, the corrected existing trace W1 shown in FIG. 9A is optimized to trace W'1 consisting of segments w'1, w'4, w'5 and w6 as shown in FIG. 9B.

Figure 10:
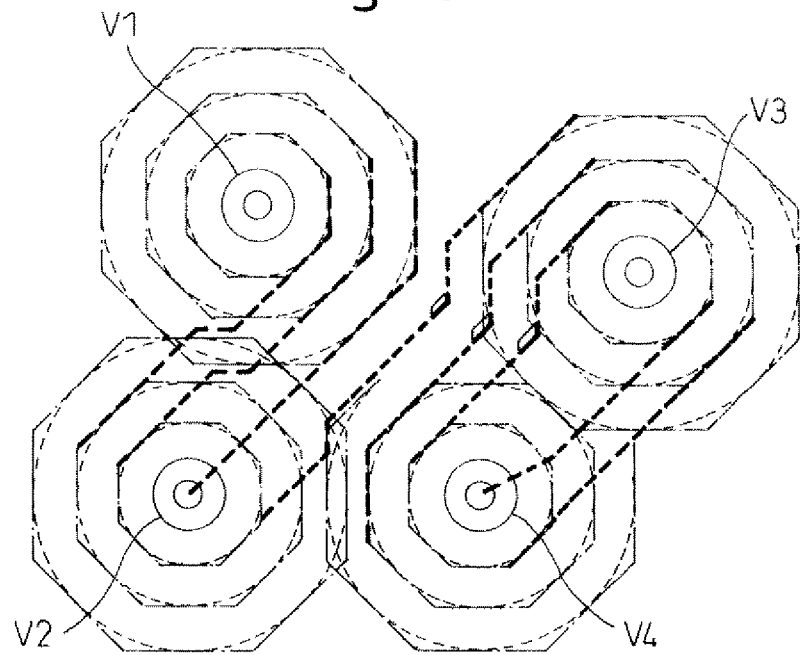

The optimization process for the corrected existing traces in step S104 described above is performed sequentially in the order identical to that in the programmed tentative disposition process for the existing traces in step S102, in other words, in the order inverse to that in the correction process for the tentatively disposed existing traces in step S103, but in the example shown in FIG. 10, the optimization process is performed sequentially in a programmed processing direction indicated by a large arrow in the figure. Here, in FIG. 10, it is to be noted that the optimized portions of the traces are indicated by thick solid lines and the portions of the traces that are not necessary to be optimized, in other words, the portions of the traces that can secure the clearance at their tentatively disposed or corrected positions are indicated by thick dotted lines. As described above, according to this embodiment, the clearance between the traces can be reliably secured, and moreover, the redundant portions of the traces can be eliminated so as to optimize the positions of the traces.

A second embodiment of the present invention implements automatic trace shaping in a case in which a plurality of obstacles are disposed adjacent to each other on a surface of a substrate of a semiconductor package. Also in the automatic trace shaping method according to this embodiment, existing traces consisting of straight and/or curved lines that are designed to be disposed in arbitrary directions on the surface of the substrate of the semiconductor package are automatically shaped into traces each consisting of a combination of segments in directions of "45×n" degrees (where n is an integer) with respect to a predetermined reference line by using computation, by setting equiangular octagons each having sides parallel with the predetermined reference line, and then, correcting positions of the existing traces so that each of the existing traces overlaps any sides of the equiangular octagons. In particular, in the automatic trace shaping method according to this embodiment, when the existing traces are shaped by setting the equiangular octagons having sides parallel with the predetermined reference line, and then, correcting the positions of the existing traces so that each of the existing traces overlaps any of the sides of the equiangular octagons, these equiangular octagons are set so as to circumscribe respective clearance circles that are circles about respective vertices on the contours of the obstacles on the surface of the substrate and that indicate positions where clearance can be obtained from such obstacles.

Figure 11:
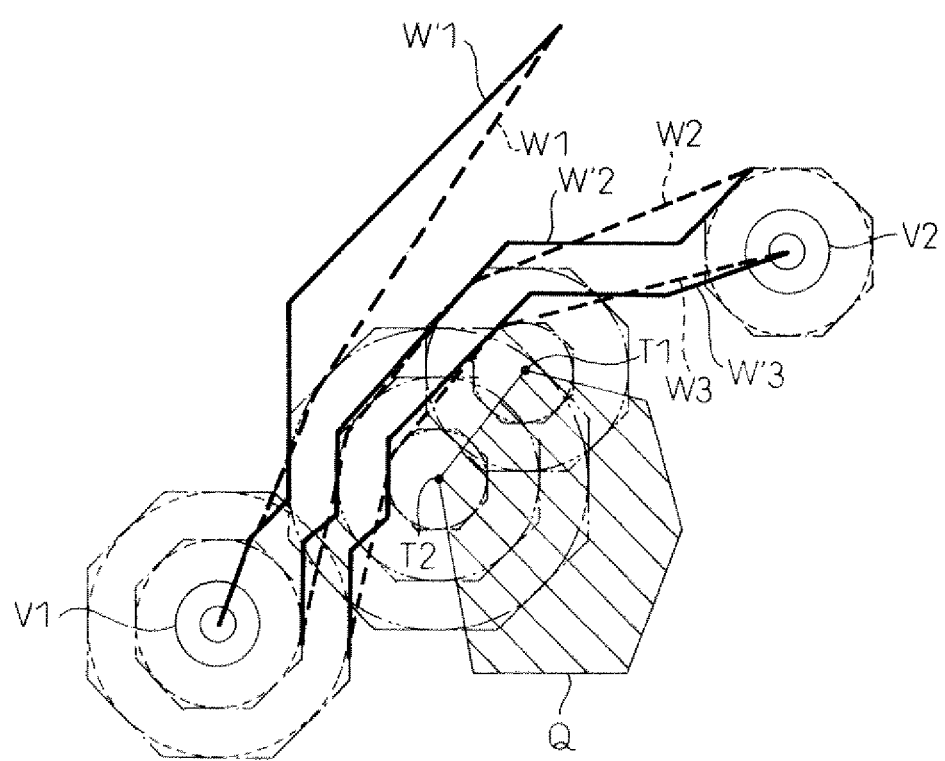
FIG. 11 is a diagram describing an automatic trace shaping method according to a second embodiment of the present invention with reference to a specific example.

FIG. 11 is a diagram for describing the automatic trace shaping method according to the second embodiment of the present invention with reference to a specific example. In this specific example, it is assumed that an obstacle S exists between vias V1 and V2 and existing traces W1, W2 and W3 exist in its neighborhood.

In the figure, circles shown by dotted lines indicate the coaxial clearance circles about the respective vias V1 and V2. In particular, the clearance circles nearest to the respective vias indicate positions where the clearance can be obtained from the respective vias. Further, the clearance circles about each identical via are separated from each other by a distance that can obtain the clearance between the traces.

In contrast to this, in the figure, circles shown by chain double-dotted lines indicate coaxial clearance circles about respective vertices T1 and T2 on a contour of the obstacle Q. In particular, the clearance circles nearest to respective vertices T1 and T2 on the contour of the obstacle Q indicate the positions where the clearance can be obtained from respective vertices T1 and T2 of the obstacle Q. Further, the clearance circles about each identical via are separated from each other by a distance that can obtain the clearance between the traces.

The equiangular octagons are set so that each of the equiangular octagons circumscribes each corresponding clearance circle and has sides parallel with the predetermined reference line, and therefore, these equiangular octagons are regular octagons. In this embodiment, the existing traces consisting of straight and/or curved lines that are designed to be disposed in the arbitrary directions on the surface of the substrate of the semiconductor package are shaped into traces each consisting of the combination of the segments in the directions of "45×n" degrees (where n is an integer) with respect to the predetermined reference line by correcting the positions of the existing traces so that each of the traces overlaps any sides of these equiangular octagons. In the example shown in FIG. 11, existing traces W1, W2 and W3 (indicate by thick dotted lines in the figure) are shaped into traces W'1, W'2 and W'3 (indicated by thick solid lines in the figure), respectively.

Figure 12:
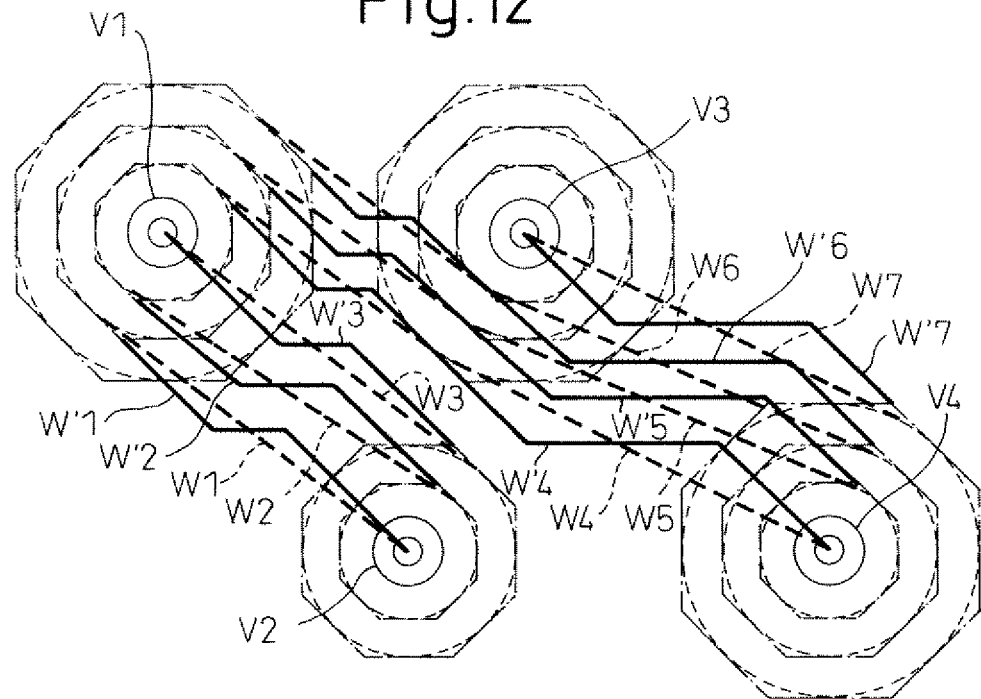
FIG. 12 is a diagram describing an automatic trace shaping method according to a third embodiment of the present invention with reference to a specific example.

Next, a third embodiment of the present invention will be described. Typically, on a surface of a substrate of a semiconductor package, traces are provided from a semiconductor chip mounted on a center portion of the semiconductor package in a direction toward a contour (in other words, an edge) of the semiconductor package (hereinafter simply referred to as a "vertical wiring direction"), but in certain cases, some traces may be disposed partially in a direction substantially orthogonal to such vertical wiring direction. The third embodiment of the present invention accommodates such a case. Also in the automatic trace shaping method according to the third embodiment of the present invention, existing traces consisting of straight and/or curved lines that are designed to be disposed in arbitrary directions on the surface of the substrate of the semiconductor package are automatically shaped into traces each consisting of a combination of segments in directions of "45×n" degrees (where n is an integer) with respect to a predetermined reference line by using computation, by setting equiangular octagons each having sides parallel with the predetermined reference line, and then, correcting the positions of the existing traces so that each of the existing traces overlaps any of the sides of the equiangular octagons. FIG. 12 is a diagram describing the automatic trace shaping method according to the third embodiment of the present invention with reference to a specific example. In this specific example, it is assumed that existing traces W1, W2, W3, W4, W5, W6 and W7 (indicated by thick dotted lines in the figure) consisting of straight line segments pass between vias V1-V4 in a direction substantially orthogonal to the wiring direction. In the figure, circles shown by dotted lines indicate the coaxial clearance circles about respective vias V1-V4. In particular, the clearance circles nearest to the respective vias indicate the positions where the clearance can be secured from the respective vias. Further, the clearance circles about each identical via are separated from each other by a distance that can secure the clearance between the traces. Equiangular octagons are set for each of vias V1-V4. The equiangular octagons are set so that each of the equiangular octagons circumscribes each corresponding clearance circle and has sides parallel with the predetermined reference line, and therefore, these equiangular octagons are regular octagons. Then, the "predetermined reference line" described above is rotated by 90 degrees in advance and the automatic trace shaping process is performed by using such a reference line. In the example shown in FIG. 12, existing traces W1, W2, W3, W4, W5, W6 and W7 are shaped into traces W'1, W'2, W'3, W'4, W'5, W'6 and W'7 (indicated by thick solid lines in the figure), respectively.

Figure 13:
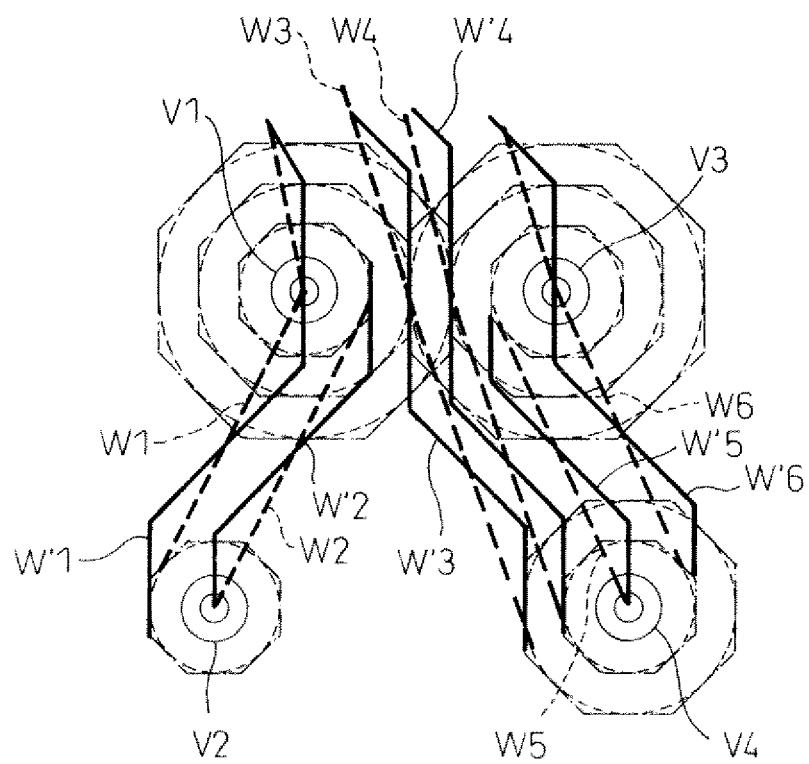
FIG. 13 is a diagram describing an automatic trace shaping method according to a fourth embodiment of the present invention with reference to a specific example.

A fourth embodiment of the present invention automatically shapes traces in a case in which a plurality of vias adjacent to each other exist on a surface of a substrate, and therefore, curved portions of the traces to be shaped exist successively. Thus, also in the automatic trace shaping method according to this embodiment, existing traces consisting of straight and/or curved lines that are designed to be disposed in arbitrary directions on the surface of the substrate of the semiconductor package are automatically shaped into traces each consisting of a combination of segments in directions of "45×n" degrees (where n is an integer) with respect to a predetermined reference line by using computation, by setting the equiangular octagons each having sides parallel with the predetermined reference line, and then, correcting the positions of the existing traces so that each of the existing traces overlaps any of the sides of the equiangular octagons. FIG. 13 is a diagram describing the automatic trace shaping method according to the fourth embodiment of the present invention with reference to a specific example. In this specific example, it is assumed that existing traces W1, W2, W3, W4, W5 and W6 (indicated by thick dotted lines in the figure) consisting of straight line segments pass between vias V1-V4. In the figure, circles shown by dotted lines indicate the coaxial clearance circles about respective vias V1-V4. In particular, the clearance circles nearest to the respective vias indicate the positions where the clearance can be secured from the respective vias. Further, the clearance circles about each identical via are separated from each other by a distance that can secure the clearance between the traces. The equiangular octagons are set so that each of the equiangular octagons circumscribes each corresponding clearance circle and has sides parallel with the predetermined reference line, and therefore, these equiangular octagons are regular octagons. In the example shown in FIG. 13, existing traces W1, W2, W3, W4, W5 and W6 are shaped into traces W'1, W'2, W'3, W'4, W'5 and W'6 (indicated by thick solid lines in the figure), respectively.

Figure 14:
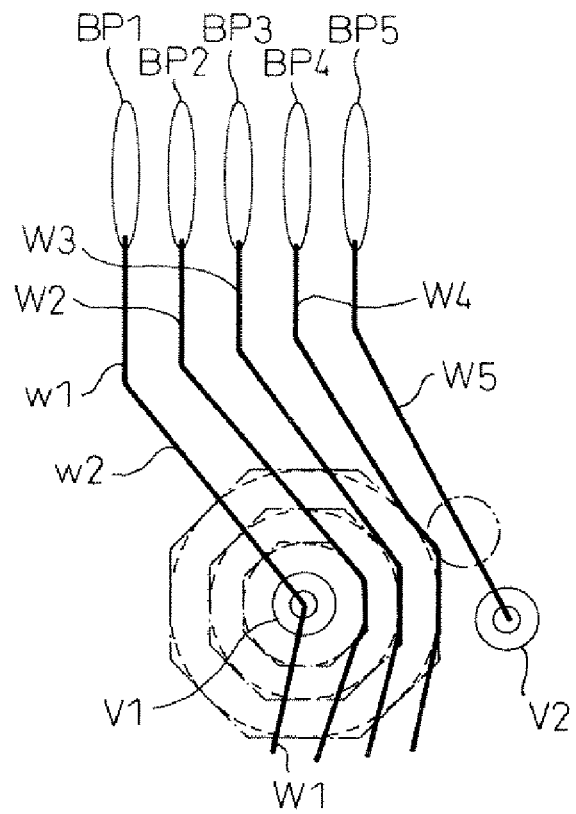
FIGS. 14A and 14B are diagrams describing an automatic trace shaping method according to a fifth embodiment of the present invention with reference to a specific example.
Figure 14:
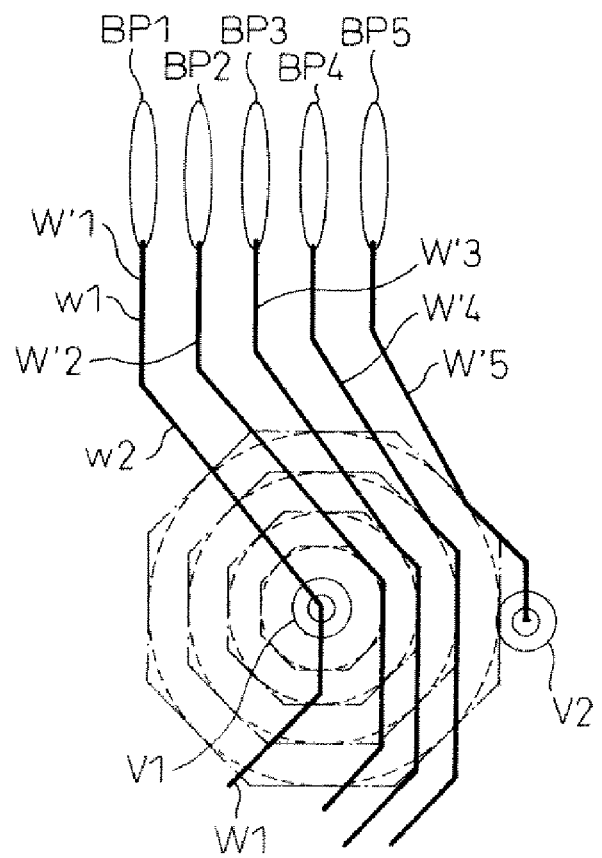

A fifth embodiment of the present invention relates to automatic shaping of traces drawn out from respective bonding pads existing on a surface of a substrate of a semiconductor package. FIGS. 14A and 14B are diagrams describing the automatic trace shaping method according to the fifth embodiment of the present invention with reference to a specific example. In this specific example, as shown in FIG. 14A, the trace shaping is considered assuming that existing traces (indicated by thick solid lines in the figure) from bonding pads BP1, BP2, BP3, BP4 and BP5 are disposed in directions toward vias V1 and V2.

In the figure, circles shown by dotted lines indicate coaxial clearance circles about the via V1. In particular, the clearance circle nearest to the via V1 indicates the position where the clearance can be secured from the via. Further, the clearance circles about the identical via are separated from each other by a distance that can secure the clearance between the traces. The equiangular octagons are set so that each of the equiangular octagons circumscribes each corresponding clearance circle and has sides in parallel with the predetermined reference line and, therefore, these equiangular octagons are regular octagons.

Generally, the bonding pads have an elliptical, rectangular or parallelogram shape. As shown in FIG. 14A, the traces have to be drawn out from the respective bonding pads by predetermined lengths in longitudinal directions of the shapes of the respective bonding pads. Such drawn-out portions are referred to as "fan-out sections". For example, with reference to the existing trace W1, the trace in the fan-out section consists of a fan-out drawn-out segment w1 and a fan-out bending segment w2. The fan-out drawn-out segment w1 has to be drawn out by a predetermined length in a longitudinal direction of the shape of the bonding pad BP1, and therefore, the disposing direction and the length of the fan-out drawn-out segment w1 cannot be changed. Due to this, in this embodiment the angle between the fan-out drawn-out segment and the fan-out bending segment is not limited to 45 degrees, but it may be an arbitrary angle. Therefore, existing traces W1, W2, W3, W4 and W5 illustrated in FIG. 14A are shaped into traces W'1, W'2, W'3, W'4 and W'5 (indicated by thick solid lines in the figure), respectively, as shown in FIG. 14B.

Figure 15A:
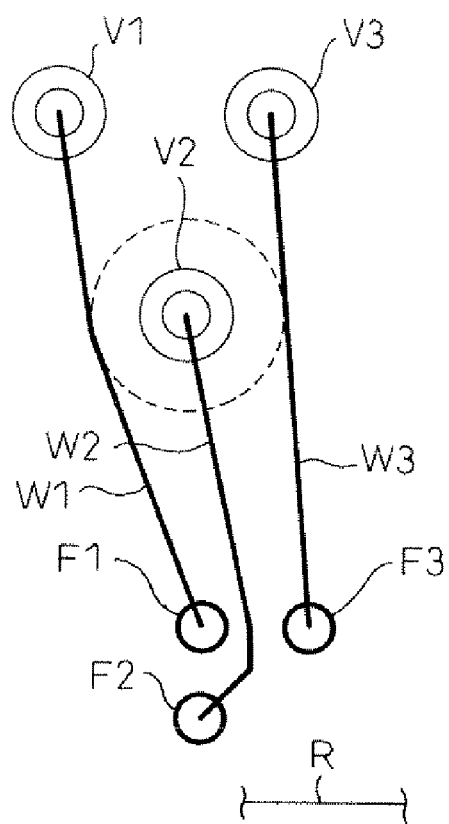
FIGS. 15A and 15B are diagrams describing an automatic trace shaping method according to a sixth embodiment of the present invention with reference to a specific example.
Figure 15B:
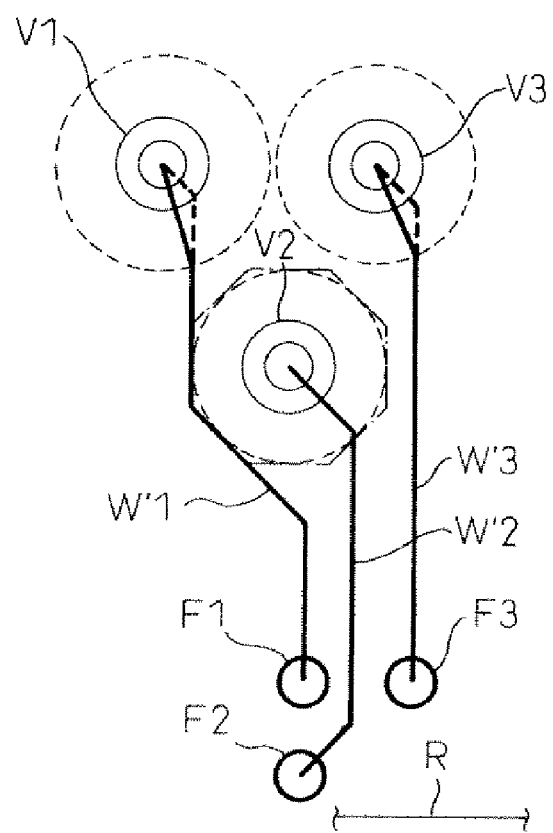

A sixth embodiment of the present invention relates to automatic shaping of traces drawn out from respective flip chip pads existing on a surface of a substrate of a semiconductor package. FIGS. 15A and 15B are diagrams describing the automatic trace shaping method according to the sixth embodiment of the present invention with reference to a specific example. In the figures, thick line circles indicate flip chip pads F1, F2 and F3. In this specific example, as shown in FIG. 15A, the trace shaping is considered assuming that existing traces W1, W2 and W3 are provided from flip chip pads F1, F2 and F3 to vias V1, V2 and V3, respectively.

An angle of a trace drawn out from a flip chip pad is determined as follows. First it is determined whether each of the existing traces drawn out from the corresponding flip chip pad forms an angle from 45 to 135 degrees with a predetermined reference line R or not. If it is determined that a segment of such an existing trace drawn out from the flip chip pad forms an angle from 45 to 135 degrees, this segment is set to be drawn out in a direction of 90 degrees with respect to the predetermined reference line R, or otherwise, this existing trace is set to drawn out in a direction of 45 (or 135) degrees with reference to the predetermined reference line R.

The vias are not always arranged in a grid-like manner. Further, the connection points between the vias and the traces often have to be teardrop shaped (also referred to as "tapered"), and therefore, bending points of the traces cannot be disposed in clearance circles for the vias. From these reasons, the existing trace is connected with the via from a direction of 45 (or 135) degrees with reference to the predetermined reference line R if possible, or otherwise, the existing trace is connected to the via at an arbitrary angle. More specifically, if an extension line of a side of the equiangular octagon and an extension line from the via with an angle of 45 (or 135) degrees (in other words, an extension line that forms an angle of 45 (or 135) degrees with the predetermined reference line R) do not intersect each other outside the clearance circle for such via, such trace is connected to the via at an arbitrary angle with respect to the predetermined reference line R. On the other hand, if the extension line of the side of the equiangular octagon and the extension line from the via with the angle of 45 (or 135) degrees intersect each other outside the clearance circle for such via, such trace is connected with the via at the 45 (or 135) degrees with reference to the predetermined reference line R. Therefore, the existing traces W1, W2 and W3 illustrated in FIG. 15A are shaped into traces W'1, W'2 and W'3 (indicated by thick solid lines in the figure), respectively, as shown in FIG. 15B.

Here, it is to be noted that equiangular octagons are used to shape the existing traces consisting of the straight and/or curved lines that are designed to be disposed in arbitrary directions into the traces each consisting of the combination of the segments in the directions of the angles of "45×n" degrees (where n is an integer) with respect to the predetermined reference line (the so-called "inclined 45-degree traces") in the embodiments of the present invention. As a variant to this, for example, equiangular hexadecagons (16-gons) may be used to shape the existing traces consisting of straight and/or curved lines that are designed to be disposed in arbitrary directions into traces each consisting of a combination of segments in directions of "22.5×n" degrees (where n is an integer) with respect to the predetermined reference line (the "inclined 22.5-degree traces"). Here, equiangular hexadecagons are used because all of the interior angles of the equiangular hexadecagons are 157.5 degrees, and if each trace is set so as to overlap any of the sides of the equiangular hexadecagons, the traces will always be oriented in the directions or "22.5×n" degrees (where n is an integer). Further, for example, equiangular 32-gons may be used to shape the existing traces into traces each consisting of a combination of segments in directions of "11.25×n" degrees (where n is an integer) (the "inclined 11.25-degree traces). Still further, for example, equiangular dodecagons may be used to shape the existing traces into traces each consisting of a combination of segments in directions of "60×n" degrees (where n is an integer) (the "inclined 60-degree traces"). As described above, traces each consisting of segments in desired directions can be implemented easily by the setting equiangular polygons according to directions of the traces.

Further, the present invention can be applied to any existing traces consisting of straight and/or curved lines that are designed to be disposed in arbitrary directions no matter what method the existing traces are designed by in advance. For example, the present invention can be applied to traces designed based on the invention as set forth in Japanese Unexamined Patent Publication No. 2002-083006 by restoring circles from "circular arcs generated around vias based on design rules" to set equiangular octagons.

Figure 16:
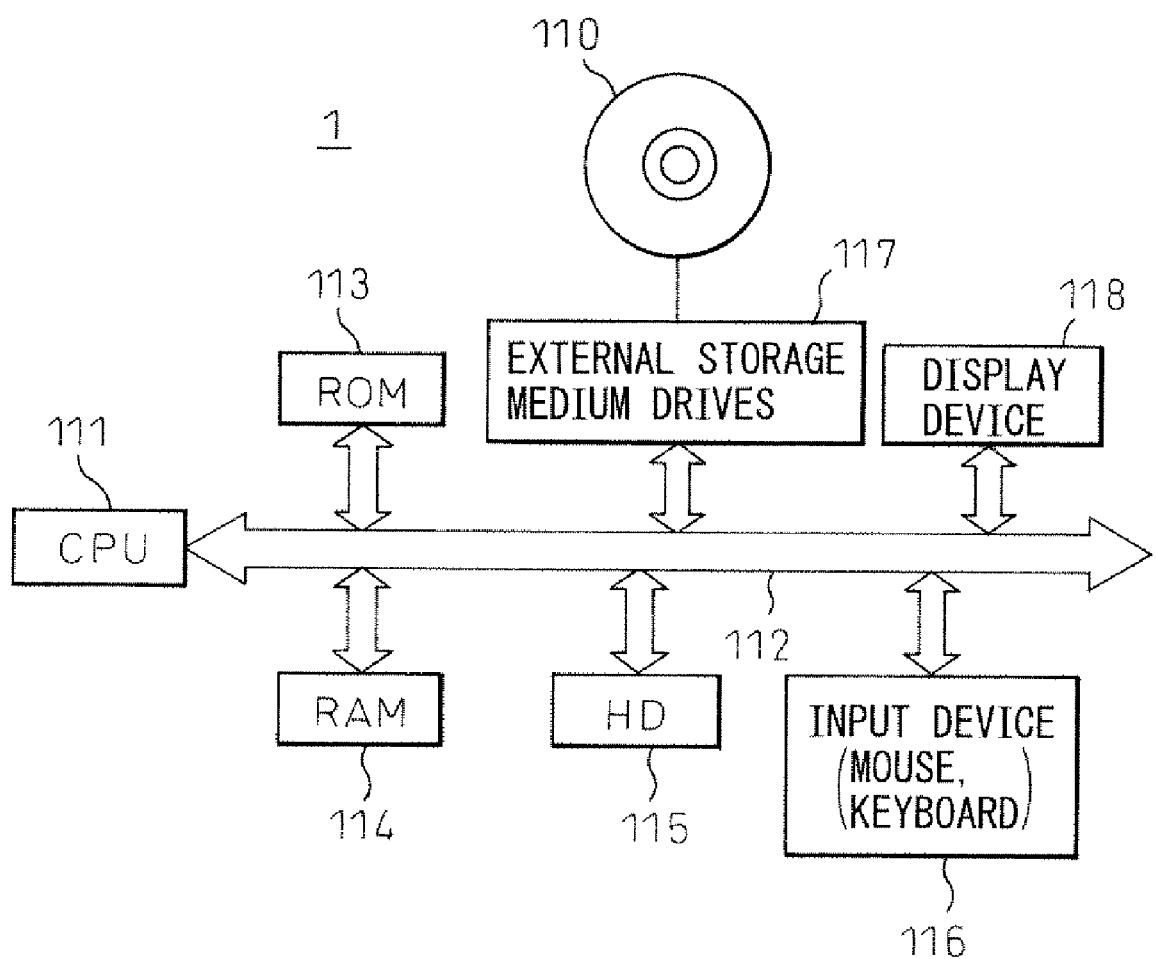
FIG. 16 is a block diagram showing a configuration of an automatic trace shaping apparatus of an embodiment of the present invention that operates according to a program that is stored in a storage medium.

An apparatus for implementing the automatic trace shaping method according to the embodiments described above is implemented by using a computer. FIG. 16 is a block diagram showing a configuration of the automatic trace shaping apparatus of the embodiments of the present invention that operates according to a program that is stored on a storage medium.

As shown in FIG. 16, a computer program for allowing a computer to perform the automatic trace shaping according to the present invention is stored on a storage medium (an external storage medium such as a flexible disk, CD-ROM, CD-R, CD-RW, DVD etc.) 110, and for example, is installed in a computer configured as described below to operate as the automatic trace shaping apparatus.

A CPU 111 controls the automatic trace shaping apparatus entirely. This CPU 111 is connected to a ROM 113, a RAM 114, a HD (hard disk drive) 115, an input device 116 such as a mouse, a keyboard and the like, an external storage medium drive 117, and a display device 118 such as a LCD, a CRT, a plasma display, an organic EL and the like through a bus 112. A control program for the CPU 111 is stored in the ROM 113.

The computer program for performing the automatic trace shaping process according to the present invention (an automatic trace shaping process program) is installed (stored) from the storage medium 110 on the HD 115. Further, in the RAM 114, a working area for the CPU 111 to perform the automatic trace shaping process and an area for storing a portion of the computer program for performing the automatic trace shaping process are secured. Moreover, in the HD 115, input data (for example, data of existing traces designed to be disposed in the arbitrary directions), final data (for example, data of traces after correction according to the present invention), and further, an OS (operating system) and the like are stored in advance.

When the computer is turned on, the CPU 111 reads the control program from the ROM 110, and further, reads the OS from the HD 115 to start the OS. As a result, the computer is ready to install the automatic trace shaping process program from the storage medium 110.

The storage medium 110 is then mounted on the external storage medium drive 117 and a control command is input from the input device 116 to the CPU 111 to read the automatic trace shaping process program stored in the storage medium 110 and store it in the HD 115 and the like. Thus, the automatic trace shaping process program is installed on the computer.

Once the automatic trace shaping process program is activated, the computer operates as the automatic trace shaping apparatus. An operator can perform the automatic trace shaping process described above by manipulating the input device 116 according to working details and procedures through an interaction indicated on the display device 118. "Data of traces after correction" obtained as a result of the process may be, for example, stored on the HD 115 for utilization in the future, or may be used to indicate the results of the process on the display device 118 visually.

Though the computer program stored in the storage medium 110 is installed on the HD 115 in the computer of FIG. 16, the present invention is not limited to such implementation and may be installed on the computer through an information transmission medium such as a LAN and the like or the program may be installed in advance in the HD 115 built in the computer.

The present invention can be applied to product design of various semiconductor packages such as CSP, PBGA, EBGA, HDS and the like.

According to the present invention, a process for shaping existing traces consisting of straight and/or curved lines that are designed to be disposed in arbitrary directions on a surface of a substrate of a semiconductor package into traces each consisting of a combination of segments in directions of specific angles (for example, of angles of "45×n" degrees, where n is an integer) with respect to a predetermined reference line can be automated by using an arithmetic processing unit such as the computer. In particular, the present invention can obtain a sufficient trace shaping result regardless of the integration density of the traces, disposition of obstacles against the traces and the like on the surface of the substrate of the semiconductor package. According to the present invention, for example, semiconductor packages also having a high trace density such as 45-degree traces can be implemented easily.

There is no compatibility between trace design data designed by a CAD for semiconductor packages and that designed by a CAD for an LSI, however, according to the present invention, trace design data designed by a CAD for semiconductor packages can be automatically changed into trace design data that can be used by a CAD for the LSI. Therefore, the need to redesign traces that have been completed for semiconductor packages so that the trace design can also be utilized in a CAD for an LSI as in the related art can be avoided.

According to the present invention, traces can be changed into those of stable quality in a short amount of time readily without being influenced by the designer's skill, experience, intuition and the like as in the related art. For example, according to the present invention, the computation result, which was obtained by taking 3-10 days in the related-art manual trace design by trial and error, can be obtained automatically within from half a day to 2 days. The need of manual trace design by trial and error as in the related art can be eliminated, and therefore, even if more complicated traces are required, traces of high quality can be implemented in a short amount of time. As a result of the reduction of design time and the burden on the designer, manufacturing costs of semiconductor packages can also be reduced.

What is claimed is:

1. An automatic trace shaping method for automatically shaping of existing traces consisting of straight and/or curved lines that are designed to be disposed in arbitrary directions on a surface of a substrate of a semiconductor package into traces each consisting of a combination of segments in directions of "45.times.n" degrees (where n is an integer) with respect to a predetermined reference line, the method comprising the steps of:

setting sets of equiangular octagons each having sides parallel with said predetermined reference line for each of vias on said surface of the substrate, wherein said equiangular octagons in each of said sets are set so that they are separated from each other by at least a distance that can secure a clearance between adjacent traces and so that they are disposed coaxially about a center position of each of said vias as their common center;

tentatively disposing the existing traces having segments passing between the vias that are adjacent to each other so that such segments overlap any sides of said equiangular octagons that are set for said vias which exit at positions nearest to such segments;

wherein the tentative disposition process is performed sequentially for each of said existing traces so that said clearance can be secured from said existing trace for which the tentative disposition process has been completed immediately before; and correcting positions of the tentatively disposed existing traces that do not have said clearance from said other adjacent tentatively disposed existing traces so that said clearance is secured from said other adjacent tentatively disposed existing traces after the tentative disposition is completed for all of the existing traces;

wherein the correction process is performed sequentially for each of said tentatively disposed existing traces in an order inverse to that in the tentative disposition process for said existing traces in said tentative disposition step.

2. The method according to claim 1 further comprising: optimizing the disposed positions of said corrected existing traces sequentially for each of said corrected existing traces in an order identical to that in the tentative disposition process for said existing traces in said tentative disposition step after the correction process in said correction step is completed for all the existing traces.

3. The method according to claim 1, wherein said tentative disposing step comprises the steps of:

redisposing such segments so as to overlap any sides of said equiangular octagons, with respect to each of the existing traces having the segments passing between said vias that are adjacent to each other;

connecting two segments that are tentatively disposed based on said equiangular octagons adjacent to each other substantially in a disposing direction of said existing trace by a segment in a direction of "45.times.n" degrees (where n is an integer) with respect to said predetermined reference line; and setting the trace consisting of a combination of said two segments obtained in said redisposition step and said segments in the direction of "45.times.n" degrees (where n is an integer) obtained in said connecting step as said tentatively disposed existing trace.

4. The method according to claim 3, wherein said redisposing step comprises the steps of:

determining whether each of the segments of said existing trace intersecting said corresponding equiangular octagon forms an angle from 45 to 135 degrees with said predetermined reference line at an intersection point of such equiangular octagon and the segment of said existing trace or not; and selecting, among sides of said equiangular octagon that is set to correspond to the segment of such existing trace, a side in the direction of 90 degrees with respect to said predetermined reference line in the neighborhood of an intersection point of the segment of such existing trace and such equiangular octagon when said determination step determines that the segment of said existing trace forms the angle from 45 to 135 degrees, or, otherwise;

selecting, among the sides of said equiangular octagon that is set to correspond to the segment of such existing trace, a side in the direction of 45 degrees or a side in the direction of 135 degrees with respect to said predetermined reference line in the neighborhood of the intersection point of the segment of such existing trace and such equiangular octagon; and wherein the segments overlapping the sides selected in said selection step are determined as said two segments connected in said redisposing step.

5. The method according to claim 4, wherein said redisposing step further comprises the step of extending or shortening the sides selected in said selecting step by predetermined lengths and the segments overlapping the sides extended or shortened in such extending or shortening step are determined as said two segments obtained in said redisposing step.

6. The method according to claim 1, wherein the innermost equiangular octagon in each set of said coaxial equiangular octagons is set so as to circumscribe a clearance circle that indicates a position where the clearance is secured from said via.

7. The method according to claim 1, wherein said existing traces have already secured the clearance from other existing traces adjacent to such existing traces, the vias or the obstacles.

8. An automatic trace shaping method, for automatically shaping existing traces consisting of straight and/or curved lines that are designed to be disposed in arbitrary directions on a surface of a substrate of a semiconductor package, into traces each consisting of a combination of segments in directions of "45.times.n" degrees (where n is an integer) with respect to a predetermined reference line comprising:

setting equiangular octagons having sides parallel with said predetermined reference line, and then, correcting the positions of said existing traces so that each of the existing traces overlaps any of the sides of such equiangular octagons, wherein said equiangular octagons are set so as to circumscribe respective clearance circles about respective vertices on contours of obstacles on said surface of the substrate and so as to indicate positions where clearance is secured from such obstacles.

9. The method according to claim 8, wherein said existing traces have already secured the clearance from other existing traces adjacent to such existing traces, the vias or the obstacles.

* * * * *